(12) United States Patent
Ashimine et al.

(10) Patent No.: US 11,830,909 B2
(45) Date of Patent: Nov. 28, 2023

(54) SEMICONDUCTOR DEVICE (71) Applicant: Murata Manufacturing Co., Ltd., Nagaokakyo (JP)

(72) Inventors: Tomoyuki Ashimine, Nagaokakyo (JP); Yuji Irie, Nagaokakyo (JP); Yasuhiro Murase, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 19 days.

(21) Appl. No.: 17/651,993

(22) Filed: Feb. 22, 2022

(65) Prior Publication Data

US 2022/0181436 A1 Jun. 9, 2022

Related U.S. Application Data (63) Continuation of application No. PCT/JP2020/016965, filed on Apr. 17, 2020.

(30) Foreign Application Priority Data

Sep. 17, 2019 (JP) .................................. 2019-168531

(51) Int. Cl.
*H01L 29/92* (2006.01)
*H01L 21/265* (2006.01)
(Continued)

(52) U.S. Cl.
CPC .... *H01L 29/0607* (2013.01); *H01L 29/66181* (2013.01); *H01L 29/94* (2013.01);
(Continued)

(58) Field of Classification Search
CPC ..................................................... H01L 29/945
See application file for complete search history.

(56) References Cited

U.S. PATENT DOCUMENTS 6,373,076 B1 * 4/2002 Alok ...................... H01L 29/872
257/454
2015/0145104 A1 * 5/2015 Bauer .................... H01L 21/283
438/381
(Continued)

FOREIGN PATENT DOCUMENTS

JP 2004214589 A 7/2004
JP 2010206108 A 9/2010
(Continued)

OTHER PUBLICATIONS

International Search Report in PCT/JP2020/016965, dated Jul. 7, 2020, 2 pages.

*Primary Examiner* — Xiaoming Liu
(74) *Attorney, Agent, or Firm* — ArentFox Schiff LLP (57) ABSTRACT A semiconductor device is provided that includes a semiconductor substrate having a first main surface and a second main surface facing each other; a dielectric layer laminated on the first main surface of the semiconductor substrate; a first electrode layer laminated on the dielectric layer; and a protective layer covering at least an outer peripheral end of the dielectric layer and an outer peripheral end of the first electrode layer. Moreover, the protective layer is provided to expose an outer peripheral end on the first main surface of the semiconductor substrate. The semiconductor substrate includes a high-resistance region positioned at least directly under an outer peripheral end of the protective layer.

18 Claims, 6 Drawing Sheets

(51) Int. Cl.
  *H01L 29/06* (2006.01)
  *H01L 29/66* (2006.01)
  *H01L 29/94* (2006.01)
  H01L 23/31 (2006.01)
  H02M 7/5387 (2007.01)

(52) U.S. Cl.
  CPC ...... *H01L 29/945* (2013.01); *H01L 21/26533* (2013.01); *H01L 23/3171* (2013.01); *H02M 7/5387* (2013.01)

(56) References Cited

U.S. PATENT DOCUMENTS

| | | |
|---|---|---|
| 2016/0027579 A1 | 1/2016 | Kurachi et al. |
| 2018/0277622 A1 | 9/2018 | Nishiyama |
| 2019/0088800 A1* | 3/2019 | Takeuchi ............ H01L 29/0607 |
| 2019/0348496 A1* | 11/2019 | Murase ................... H01G 4/33 |
| 2019/0378893 A1* | 12/2019 | Ashimine ......... H01L 21/02271 |
| 2020/0066445 A1 | 2/2020 | Nakagawa et al. |
| 2020/0335969 A1* | 10/2020 | Lee .................... H02M 7/5387 |

FOREIGN PATENT DOCUMENTS

| | | |
|---|---|---|
| JP | 2016025310 A | 2/2016 |
| WO | 2017145515 A1 | 8/2017 |
| WO | 2018211919 A1 | 11/2018 |
| WO | 2019021817 A1 | 1/2019 |

\* cited by examiner

SEMICONDUCTOR DEVICE

CROSS REFERENCE TO RELATED APPLICATIONS

The present application is a continuation of PCT/JP2020/016965 filed Apr. 17, 2020, which claims priority to Japanese Patent Application No. 2019-168531, filed Sep. 17, 2019, the entire contents of each of which are incorporated herein by reference.

TECHNICAL FIELD

The present invention relates to a semiconductor device.

BACKGROUND

Japanese Patent Application Laid-Open No. 2016-25310 (hereinafter "Patent Document 1") describes, as an example of a semiconductor device, a thin film capacitor in which a substrate also serving as a lower electrode layer, a dielectric layer, and an upper electrode layer are laminated in this order and in which a protective layer is formed on the upper electrode layer so as to expose an end portion of the substrate.

However, when such a semiconductor device, as described in Patent Document 1, is used in an inverter circuit or the like under a DC bias or an AC bias, there is a problem in that a structural defect occurs in a protective layer and reliability of the semiconductor device is decreased. In particular, there is a problem that a structural defect is likely to occur during use under a DC bias.

SUMMARY OF THE INVENTION

Thus, an object of the exemplary embodiments of the present invention is to provide a semiconductor device having improved reliability.

It is assumed that such a semiconductor device as described in Patent Document 1 is used in an inverter circuit or the like under a DC bias or an AC bias, with the substrate serving as the anode side, in a high-humidity environment. According to findings by the present inventors, when a substrate portion in contact with the outer peripheral end portion of the protective film is oxidized by anodization, the volume of the substrate portion expands, and a structural defect may occur at the outer peripheral end portion of the protective layer. In particular, in use under a DC bias, since the substrate always serves as the anode side, a structural defect is likely to occur. This structural defect decreases the moisture resistance function and the discharge prevention function of the protective layer and also decreases the reliability of the semiconductor device.

On the other hand, when the protective layer covers up to the end portion of the substrate, cracks occur in the protective layer due to damage in dicing, moisture enters through the cracks, and anodization is promoted, so that a structural defect of the protective layer occurs. In addition, when the end portion of the substrate is covered with a metal guard ring, there is a risk of creeping discharge in a high-humidity environment. Unlike air discharge, creeping discharge depends on the surface state, such as the contamination degree and the dielectric properties of a protective layer serving as an insulating layer. Thus, it is difficult to address creeping discharge by design change. Therefore, addressing substrate anodization has been insufficient.

Thus, according to an exemplary aspect of the present invention, a semiconductor device is provided that includes a semiconductor substrate having a first main surface and a second main surface facing each other; a dielectric layer laminated on the first main surface of the semiconductor substrate; a first electrode layer laminated on the dielectric layer; and a protective layer covering at least an outer peripheral end of the dielectric layer and an outer peripheral end of the first electrode layer. Moreover, the protective layer is provided so as to expose an outer peripheral end on the first main surface of the semiconductor substrate. The semiconductor substrate includes a high-resistance region positioned at least directly under an outer peripheral end of the protective layer.

According to the present invention, a semiconductor device is provided having improved reliability by suppressing anodization of a substrate of the semiconductor device.

DETAILED DESCRIPTION

Hereinafter, exemplary embodiments of the present invention will be described with reference to the drawings as appropriate. It should be noted that the following description is provided for those skilled in the art to fully understand the present invention and is not intended to limit the present invention to the following contents. In addition, in the following description, substantially the same configurations are denoted by the same reference numerals, and redundant description may be omitted.

First Exemplary Embodiment

Figure 1:
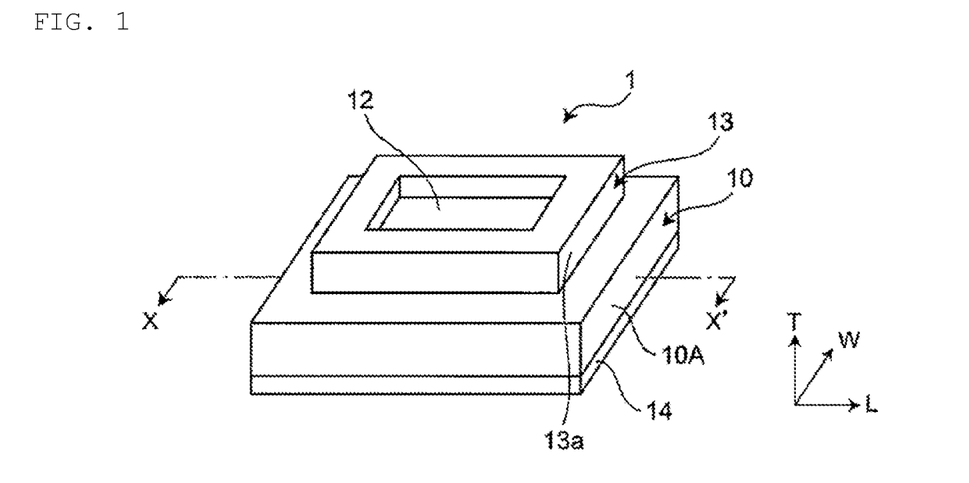
FIG. 1 is a schematic perspective view showing a structure of a semiconductor device according to a first exemplary embodiment.
Figure 2:
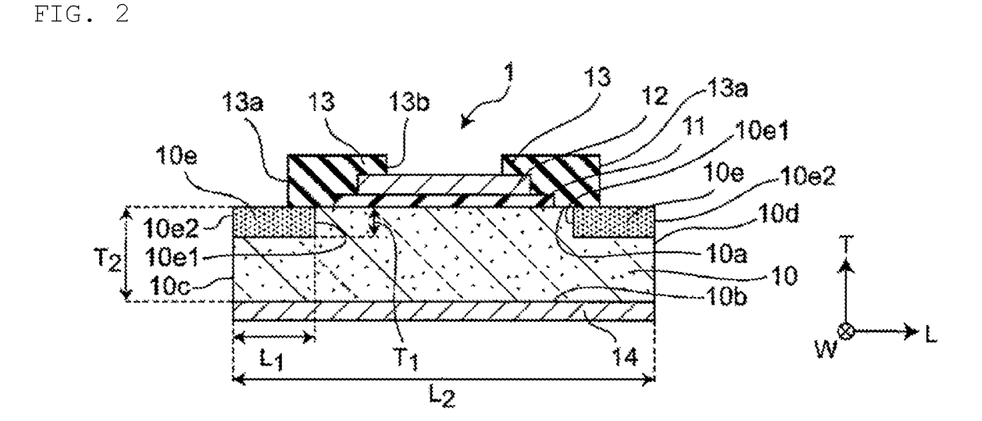
FIG. 2 is a schematic perspective view showing a structure of the semiconductor device according to the first exemplary embodiment.

FIG. 1 is a schematic perspective view showing an example of a structure of a semiconductor device according to a first exemplary embodiment. FIG. 2 is a schematic sectional view taken along line X-X' of the semiconductor device in FIG. 1 and is an LT sectional view passing through the center in the W direction. It should be noted that for purposes of this disclosure, the L direction is a length direction of the semiconductor device 1, the W direction is a width direction of the semiconductor device 1, and the T direction is a height direction of the semiconductor device 1.

As shown, the semiconductor device 1 includes a semiconductor substrate 10 having a first main surface 10a and a second main surface 10b facing each other and an outer peripheral surface 10A including four side surfaces positioned between the first main surface and the second main surface; a dielectric layer 11 laminated on the first main surface 10a of the semiconductor substrate 10; a first electrode layer 12 laminated on the dielectric layer 11; a protective layer 13 having an annular shape and covering outer peripheral end portions of the dielectric layer 11 and the first electrode layer 12; and a second electrode layer 14 formed on the second main surface 10b. Moreover, the outer peripheral end portion 13a (i.e., the outer peripheral end) of the protective layer 13 is positioned inside the outer peripheral surface 10A of the semiconductor substrate 10 and has an opening 13b in the central portion.

The semiconductor substrate 10 has a rectangular shape in plan view, has the first main surface 10a and the second main surface 10b facing each other in the T direction, has a pair of side surfaces 10c and 10d facing each other in the L direction, and also has a pair of side surfaces (not shown) facing each other in the W direction. Here, the pair of side surfaces 10c and 10d facing each other in the L direction and the pair of side surfaces facing each other in the W direction form the outer peripheral surface 10A of the semiconductor substrate 10.

According to an exemplary aspect, a silicon substrate can be used for the semiconductor substrate 10, for example. The conductivity type of the silicon substrate is not particularly limited, and any of the p-type and the n-type can be used. As the p-type impurity, B can be used, and as the n-type impurity, P, As, Sb, or the like can be used.

The semiconductor substrate 10 includes a high-resistance region 10e positioned at least directly under the outer peripheral end portion 13a of the protective layer 13. Here, the outer peripheral end portion 13a of the protective layer 13 is a portion including the end surface of the protective layer 13 and a region from the outermost peripheral end to a predetermined inner position and forms a boundary with the semiconductor substrate in plan view. In addition, being positioned at least directly under the outer peripheral end portion 13a of the protective layer 13 means being positioned at least on the lower side (i.e., in the depth direction) of the outer peripheral end portion 13a of the protective layer 13. In addition, the high-resistance region 10e is a region having a resistivity higher than a region (e.g., a low-resistance region) other than the high-resistance region 10e in the semiconductor substrate 10 and has a resistivity in a range of $10^2$ Ω·cm or more and $10^9$ Ω·cm or less, and preferably $10^3$ Ω·cm or more and $10^5$ Ω·cm or less. According to an exemplary aspect, and as described above, the resistivity in the low-resistance region is $10^{-5}$ Ω·cm or more and less than $10^2$ Ω·cm, and preferably $10^{-3}$ Ω·cm or more and $10^1$ Ω·cm or less. It should be noted that the resistivity can be measured using a known measurement method, for example, a four-point probe method.

In addition, the depth (or thickness) of the high-resistance region 10e is not particularly limited as long as the high-resistance region 10e is directly under the outer peripheral end portion 13a of the protective layer 13. In sectional view, the thickness T1 of the high-resistance region 10e preferably extends over a range of at least 1 μm from the surface of the semiconductor substrate 10 and more preferable that the thickness T1 of the high-resistance region 10e extends entirely over the semiconductor substrate 10 in the thickness direction. Alternatively, when the thickness of the semiconductor substrate 10 is T2, (T1/T2) is 0.0001 or more and 1 or less. In addition, in sectional view, when the width of the high-resistance region 10e is L1 and the width of the semiconductor substrate 10 is L2, (L1/L2) is 0.001 or more and 0.1 or less, and preferably 0.01 or more and 0.05 or less. It should be noted that unless otherwise stated, in the present specification, the term "sectional view" refers to sectional view in the thickness direction of the semiconductor device 1.

In addition, in sectional view, the high-resistance region 10e is preferably provided on the outer peripheral end portion side of the semiconductor substrate 10 with respect to the outer peripheral end portion of the first electrode layer 12. Furthermore, the high-resistance region 10e is preferably provided on the outer side with respect to the outer peripheral end portion of the dielectric layer 11. This is because if the high-resistance region 10e is provided on the center side of the semiconductor substrate 10 with respect to the outer peripheral end portion of the first electrode layer 12 in sectional view, the capacitance density of the semiconductor device 1 decreases. For example, the high-resistance region 10e may be formed in an annular shape so as to surround the first electrode layer 12 in plan view. FIG. 2 is an example thereof, the high-resistance region 10e includes an inner peripheral side end portion 10e1 and an outer peripheral side end portion 10e2 in sectional view, the inner peripheral side end portion 10e1 is provided on the outer peripheral surface side of the semiconductor substrate 10 with respect to the end portion of the first electrode layer 12, and the outer peripheral side end portion 10e2 reaches the outer peripheral surface (side surfaces 10c and 10d in FIG. 1) of the semiconductor substrate 10. Since providing the outer peripheral side end portion 10e2 up to the outer peripheral surface of the semiconductor substrate 10 forms the high-resistance region 10e at the end portion of the substrate 10, a discharge distance between the electrode 12 and the substrate 10 is extended so as to obtain a structure advantageous for suppressing creeping discharge. It is also noted that when the high-resistance region 10e is formed in an annular shape in plan view, the annular shape includes not only a circular shape but also a polygonal shape, and the polygonal shape includes not only a shape having rectangular corners but also a shape having curved rectangular corners, according to various exemplary aspects.

Figure 3:
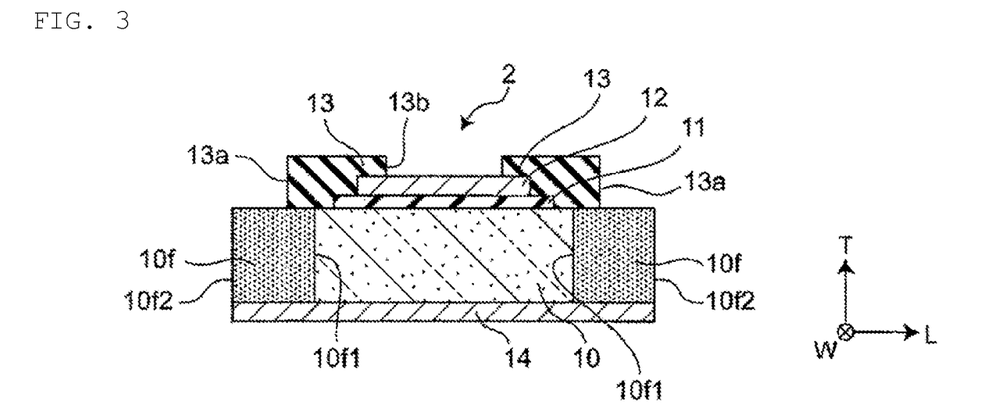
FIG. 3 is a schematic perspective view showing a structure of the semiconductor device according to the first exemplary embodiment.

In addition, FIG. 3 is another example in which a high-resistance region 10f includes an inner peripheral side end portion 10f1 and an outer peripheral side end portion 10f2 in sectional view. As shown, the inner peripheral side end portion 10f1 is provided on the outer peripheral surface side of the semiconductor substrate 10 with respect to the end portion of the first electrode layer 12, and the outer peripheral side end portion 10f2 reaches the outer peripheral surface of the semiconductor substrate 10 and is further formed entirely over the semiconductor substrate 10 in the thickness direction. According to this configuration, increasing the thickness of the high-resistance region 10f enables anodization of the semiconductor substrate 10 to be further suppressed.

Figure 4:
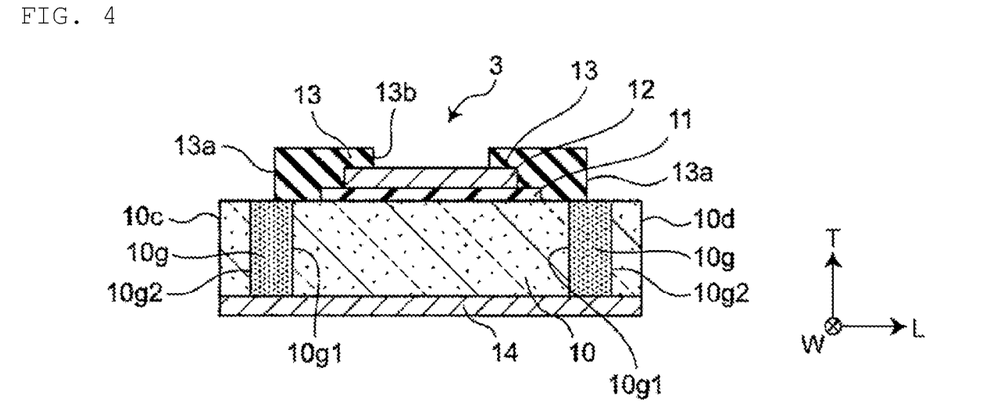
FIG. 4 is a schematic perspective view showing a structure of the semiconductor device according to the first exemplary embodiment.

In addition, FIG. 4 is another example, a high-resistance region 10g includes an inner peripheral side end portion 10g1 and an outer peripheral side end portion 10g2 in sectional view, the inner peripheral side end portion 10g1 is provided on the outer peripheral surface side of the semiconductor substrate 10 with respect to the end portion of the first electrode layer 12, and the outer peripheral side end portion 10g2 is separated from the outer peripheral surface of the semiconductor substrate 10 and is further formed entirely over the semiconductor substrate 10 in the thickness direction. Since the high-resistance region 10g does not extend to the dicing line due to the outer peripheral side end portion 10g2 being separated from the peripheral surface of the semiconductor substrate 10, possible damage to the high-resistance region 10g due to chipping during dicing can be reduced or eliminated.

According to an exemplary aspect, a high-resistance region can be formed, for example, by performing doping with oxygen ions in an ion implantation method and performing high-temperature heat treatment. This method is known as separation by implanted oxygen, and a silicon oxide film having high resistance is formed in a silicon substrate. Specifically, the following method can be used according to an exemplary aspect. As the semiconductor substrate, a silicon substrate doped with p-type impurities or n-type impurities at an impurity concentration of, for example, $5 \times 10^{16}$ cm$^{-3}$ or more is used. Oxygen ions are implanted into the silicon substrate at a density of about $4 \times 10^{17}$ cm$^{-3}$, and annealing is performed at 1300° C. The implantation depth can be adjusted by changing implantation conditions such as implantation energy.

In an exemplary aspect, the dielectric layer 11 can be formed of silicon oxide having insulating properties, for example, $SiO_2$. The dielectric layer 11 can be formed using, for example, a method of oxidizing a silicon substrate by thermal oxidation or the like, or a CVD method. The thickness of the dielectric layer 11 is 0.01 μm or more and 10 μm or less, and preferably 0.1 μm or more and 3 μm or less. In addition, the dielectric layer 11 may have a single layer or may have a laminated structure with a plurality of dielectrics. The laminated structure enables more appropriate capacitance and withstand voltage design.

For the first electrode layer 12, a metal material such as molybdenum, aluminum, gold, tungsten, platinum, or titanium can be used. The first electrode layer can be formed using a sputtering method or a vacuum deposition method. The thickness of the first electrode layer is 0.1 μm or more and 10 μm or less, and preferably 0.5 μm or more and 3 μm or less.

For the protective layer 13, an inorganic insulating material such as silicon oxynitride or silicon nitride or an insulating resin material such as polyimide can be used. The thickness of the protective layer 13 is 0.2 μm or more and 30 μm or less, and preferably 0.5 μm or more and 10 μm or less. It is noted that the protective layer 13 preferably has an annular shape in plan view. The annular shape includes not only a circular shape but also a polygonal shape, and the polygonal shape includes not only a shape having rectangular corners but also a shape having curved rectangular corners.

For the second electrode layer 14, the same material as that of the first electrode layer 12 can be used. The thickness of the second electrode layer 14 is 0.1 μm or more and 10 μm or less, and preferably 0.5 μm or more and 3 μm or less. It is noted that in the present embodiment, a p-type conductivity-type or n-type conductivity-type silicon substrate is used for the semiconductor substrate 10, and the low-resistance region of the semiconductor substrate 10 can also function as an electrode, so that the second electrode layer 14 can be omitted.

The semiconductor device according to the present embodiment can be used under a DC bias or an AC bias, but can also be suitably used under a DC bias in another aspect. In this case, the semiconductor substrate is connected to the positive electrode of the DC power supply as the positive electrode, and the first electrode layer is connected to the negative electrode of the DC power supply as the negative electrode. It is noted that when the semiconductor substrate is provided with the second electrode layer, the second electrode layer is connected to the positive electrode of the DC power supply as a positive electrode.

(Manufacturing Method)

Figure 5A:
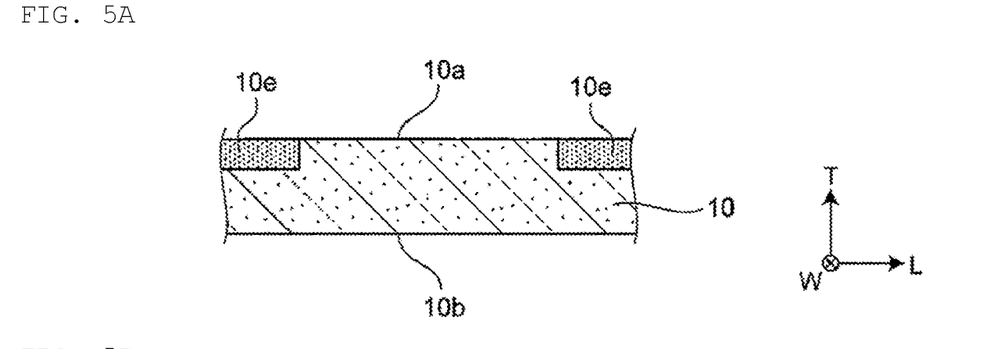
FIG. 5A is a schematic perspective view showing a manufacturing step of the semiconductor device according to the first exemplary embodiment.
Figure 5B:
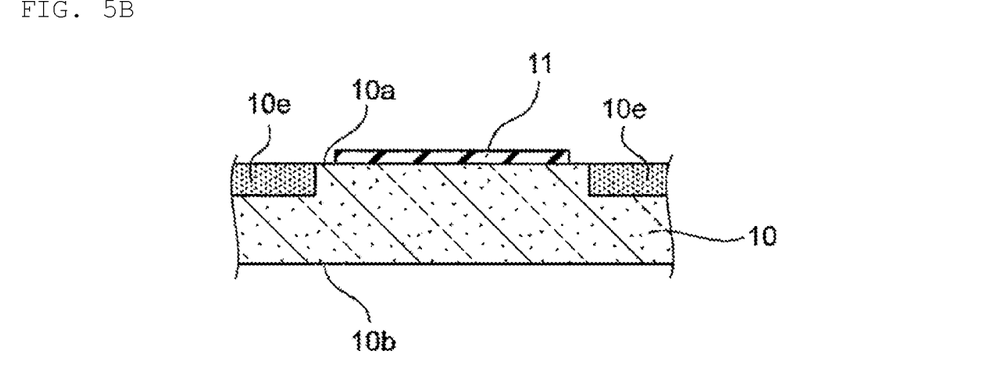
FIG. 5B is a schematic perspective view showing a manufacturing step of the semiconductor device according to the first exemplary embodiment.
Figure 5C:
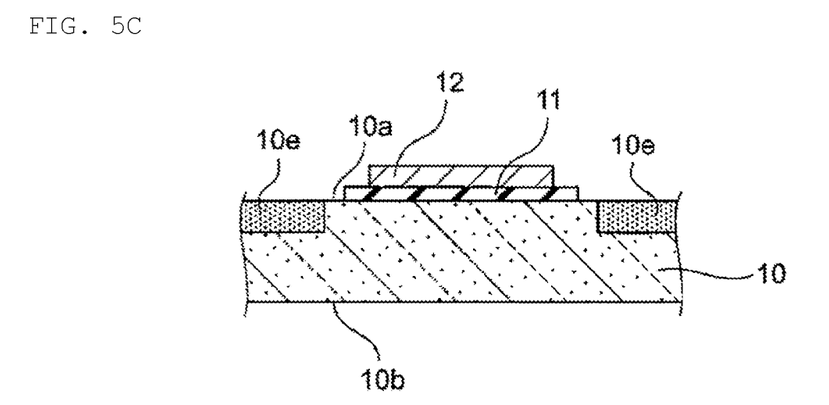
FIG. 5C is a schematic perspective view showing a manufacturing step of the semiconductor device according to the first exemplary embodiment.
Figure 5D:
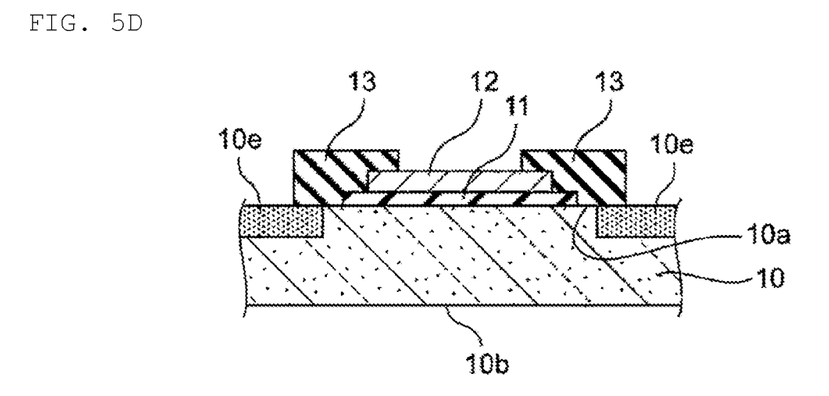
FIG. 5D is a schematic perspective view showing a manufacturing step of the semiconductor device according to the first exemplary embodiment.
Figure 5E:
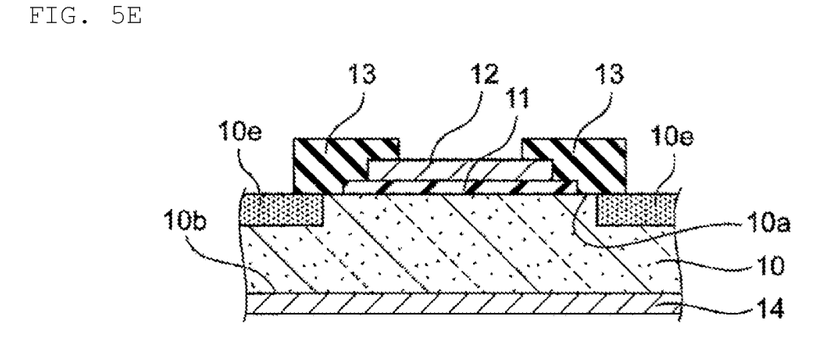
FIG. 5E is a schematic perspective view showing a manufacturing step of the semiconductor device according to the first exemplary embodiment.

The semiconductor device according to the present embodiment can be manufactured using the following method according to an exemplary aspect. Description will be made with reference to FIGS. 5A to 5E. First, using a low-resistance silicon substrate 10 having a first main surface 10a and a second main surface 10b facing each other, implanting oxygen ions by an ion implantation method into a region serving as an element end portion including a dicing line, and performing heat treatment forms a high-resistance region 10e in a predetermined region of the first main surface 10a of the silicon substrate 10 (FIG. 5A). Next, forming a dielectric film made of $SiO_2$ on the first main surface 10a of the silicon substrate 10 by a CVD method, and performing patterning by photolithography and dry etching forms the dielectric layer 11 (FIG. 5B). Next, forming a metal film on the dielectric layer 11 by a sputtering method, and performing patterning by photolithography and wet etching forms the first electrode layer 12 (FIG. 5C). Here, the first electrode layer 12 is formed so that the high-resistance region is positioned on the peripheral surface side of the semiconductor substrate 10 with respect to the end portion of the first electrode layer 12 in sectional view. Next, forming a silicon nitride film ($Si_3N_4$) by a CVD method so as to cover the end portion of the first electrode layer 12 and performing patterning by photolithography and dry etching forms the protective layer 13 having an opening at the center in plan view (FIG. 5D). Here, the protective layer 13 is formed so that the high-resistance region 10e is positioned at least directly under the outer peripheral end portion of the protective layer 13. Next, polishing the second main surface 10b of the semiconductor substrate 10 and forming the second electrode layer 14 made of a metal film by a sputtering method is performed (FIG. 5E). Next, cutting the semiconductor substrate with a dicing machine and separating the semiconductor substrate into individual pieces obtains the semiconductor device 1.

As a cause of the decrease in reliability of the semiconductor device due to the anodization of the substrate, it is considered that in a high-humidity environment, when the substrate portion in contact with the outer peripheral end portion of the protective film is oxidized by the anodization, the volume of the substrate portion expands, a structural defect occurs at the outer peripheral end portion of the protective layer, and moisture enters through the anodized portion of the substrate. According to the present embodiment, since the semiconductor substrate includes a high-resistance region positioned at least directly under the outer peripheral end portion of the protective layer as described above, even when the semiconductor substrate becomes an anode, a potential is applied only between the first electrode layer and the low-resistance region of the semiconductor substrate with the dielectric layer therebetween and almost no potential is applied to the high-resistance region. Therefore, since the high-resistance region does not function as an anode, anodization of the semiconductor substrate in the boundary region with the protective layer can be suppressed. Accordingly, since volume expansion due to anodization does not occur in the boundary region between the semiconductor substrate and the protective layer, the occurrence of a structural defect at the outer peripheral end portion of the protective layer can be prevented. In addition, ingress of moisture into the dielectric film through the anodized portion of the substrate can also be prevented. These actions enable the reliability of the semiconductor device to be improved.

Second Exemplary Embodiment

In the present embodiment, a semiconductor device in which a trench is formed on a first main surface of a semiconductor substrate will be described. FIGS. 6A to 6H are schematic sectional views showing an example of a method for manufacturing a semiconductor device 4 according to the present embodiment.

First, the structure of the semiconductor device 4 will be described. As shown in FIG. 6H, for example, the semiconductor device 4 includes a semiconductor substrate 20 having a first main surface 20a and a second main surface 20b facing each other and an outer peripheral surface 20A including four side surfaces positioned between the first main surface 20a and the second main surface 20b and having a plurality of trenches 20d formed on the first main surface 20a; a dielectric layer 21 formed along the plurality of trenches 20d and laminated on the first main surface 20a; a first electrode layer 24 laminated on the dielectric layer 21; and a protective layer 25 covering at least end portions of the dielectric layer 21 and the first electrode layer 24. Furthermore, the semiconductor substrate 20 includes a high-resistance region 20c positioned at least directly under the outer peripheral end portion 25a of the protective layer 25. In addition, the first electrode layer 24 includes a first conductive layer 22 laminated on the dielectric layer 21 and a second conductive layer 23 laminated on the first conductive layer 22.

Similar to the first embodiment described above, a p-type conductivity-type or n-type conductivity-type silicon substrate can be used for the semiconductor substrate 20. In an exe4mplary aspect, the thickness of the semiconductor substrate is 10 μm or more and 1000 μm or less, and preferably 50 μm or more and 400 μm or less.

At least one trench 20d is to be formed on the first main surface 20a of the semiconductor substrate 20. The trench 20d is a groove or a hole formed in a direction perpendicular to the first main surface 20a of the semiconductor substrate 20. FIG. 6H shows an LT section when a plurality of grooves having a rectangular shape in plan view are formed as the plurality of trenches 20d; and the plurality of grooves are formed so that short sides of the rectangular grooves are parallel to the L direction. The plurality of trenches 20d may be columnar holes formed in a matrix shape in the L direction and the W direction. The depth of the trench 20d is 5 μm or more and 100 μm or less, and preferably 20 μm or more and 50 μm or less. In addition, the width of the trench 20d, for example, the width of the groove or the diameter of the hole in the LT section is 1 μm or more and 10 μm or less, and preferably 2 μm or more and 5 μm or less. The trench 20d can be formed by, for example, dry etching.

The semiconductor substrate 20 includes a high-resistance region 20c positioned at least directly under the outer peripheral end portion 25a of the protective layer 25. The high-resistance region 20c is annularly formed so as to surround the first electrode layer 24 in plan view. The high-resistance region 20c includes an inner peripheral side end portion 20c1 and an outer peripheral side end portion 20c2 in sectional view, the inner peripheral side end portion 20c1 is provided on the outer peripheral surface side of the semiconductor substrate 20 with respect to the end portion of the first electrode layer 24, and the outer peripheral side end portion 20c2 is separated from the outer peripheral surface of the semiconductor substrate 20 and is further formed entirely over the semiconductor substrate 20 in the thickness direction. Since the semiconductor substrate includes a high-resistance region positioned at least directly under the outer peripheral end portion of the protective layer, anodization of the semiconductor substrate in the boundary region with the protective layer can be suppressed even when the semiconductor substrate becomes an anode. In addition, since the outer peripheral side end portion 20c2 is separated from the outer peripheral surface of the semiconductor substrate 20, the high-resistance region 10g does not exist in the dicing line, so that damage to the high-resistance region 20c due to chipping during dicing can be reduced. It is noted that when the high-resistance region 20c is formed in an annular shape in plan view, the annular shape includes not only a circular shape, but can also be a polygonal shape, and the polygonal shape includes not only a shape having rectangular corners, but also a shape having curved rectangular corners.

As further shown, the dielectric layer 21 is formed along the trench 20d. The dielectric layer 21 can be formed of silicon oxide having insulating properties, for example, $SiO_2$. Moreover, the dielectric layer 21 can be formed using, for example, a method of oxidizing a silicon substrate by thermal oxidation or the like or a CVD method. The thickness of the dielectric layer 21 is 0.01 μm or more and 5 μm or less, and preferably 0.1 μm or more and 3 μm or less. In addition, the dielectric layer 21 may have a single layer or may have a laminated structure with a plurality of dielectrics. The laminated structure enables more appropriate capacitance and withstand voltage design.

The first electrode layer 24 includes the first conductive layer 22 laminated on the dielectric layer 21 and the second conductive layer 23 laminated on the first conductive layer 22. For the first conductive layer 22, a silicon-based conductive material such as p-type or n-type polycrystalline silicon (polysilicon) can be used. The first conductive layer 22 can be formed using a CVD method. The thickness of the first conductive layer 22 is 0.1 µm or more and 3 µm or less, and preferably 0.5 µm or more and 1 µm or less. On the other hand, for the second conductive layer 23, a metal material such as molybdenum, aluminum, gold, tungsten, platinum, or titanium can be used. The second conductive layer 23 can be formed using a sputtering method or a vacuum deposition method. The thickness of the second conductive layer 23 is 0.1 µm or more and 10 µm or less, and preferably 0.5 µm or more and 3 µm or less. It should be noted that when the adhesiveness between the second conductive layer 23 and the dielectric layer 21 is sufficiently high and the second conductive layer 23 can be formed also on the dielectric layer 21 in the trench 20d with a high coverage factor, the first conductive layer 22 may be omitted, and the second conductive layer 23 may be formed directly on the dielectric layer 21.

For the protective layer 25, an inorganic insulating material such as silicon oxynitride or silicon nitride, or an insulating resin material such as polyimide, can be used. The thickness of the protective layer 25 is 0.3 µm or more and 30 µm or less, and preferably 1.2 µm or more and 10 µm or less. It is noted that the protective layer 25 preferably has an annular shape in plan view. The annular shape includes not only a circular shape, but can also be a polygonal shape, and the polygonal shape includes not only a shape having rectangular corners, but also a shape having curved rectangular corners.

For the second electrode layer 26, the same material as that of the first electrode layer can be used. The thickness of the second electrode layer 26 is 0.1 µm or more and 10 µm or less, and preferably 0.5 µm or more and 3 µm or less. It is noted that in the present embodiment, a p-type conductivity-type or n-type conductivity-type silicon substrate is used for the semiconductor substrate, and the semiconductor substrate 20 can also function as an electrode, so that the second electrode layer can be omitted.

The semiconductor device 4 according to the present embodiment can be manufactured using, for example, the following method.

(Formation of High-Resistance Region)

Figure 6A:
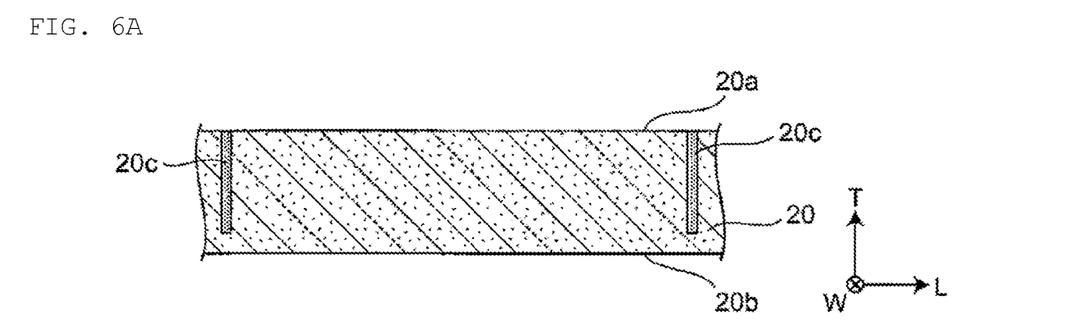
FIG. 6A is a schematic perspective view showing a manufacturing step of a semiconductor device according to a second exemplary embodiment.

First, using a wafer 20 made of low-resistance silicon (having resistivity of, for example, 5 Ω·cm) having the first main surface 20a and the second main surface 20b facing each other, implanting oxygen ions by an ion implantation method into a region serving as an element end portion including a dicing line, and performing heat treatment forms a high-resistance region 20c in a predetermined region of the wafer 20 (FIG. 6A).

(Formation of Trench)

Figure 6B:
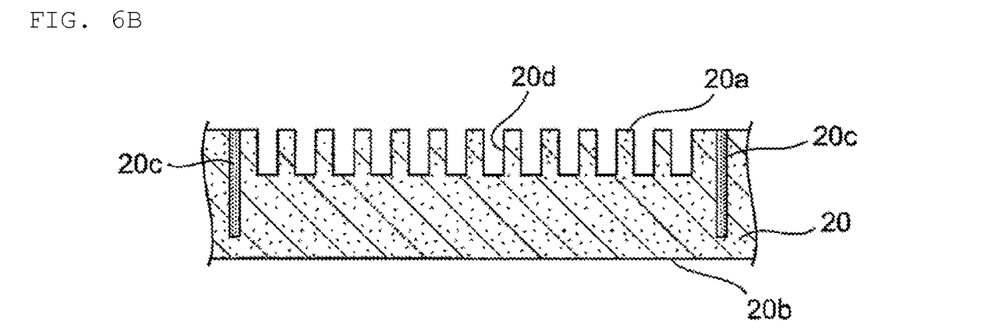
FIG. 6B is a schematic perspective view showing a manufacturing step of the semiconductor device according to the second exemplary embodiment.

Next, performing deep etching on the wafer 20 by photolithography and a Bosch process forms the plurality of trenches 20d (FIG. 6B).

(Formation of Dielectric Layer)

Figure 6C:
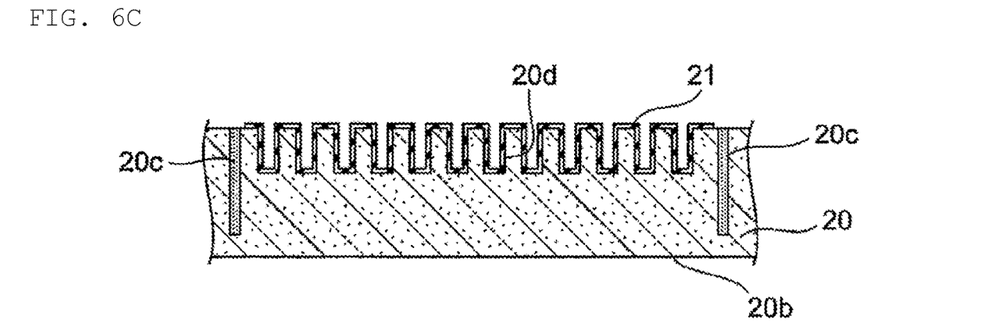
FIG. 6C is a schematic perspective view showing a manufacturing step of the semiconductor device according to the second exemplary embodiment.

Next, forming a dielectric film made of SiO$_2$ along the plurality of trenches 20d by a CVD method and performing patterning by photolithography and dry etching forms the dielectric layer 21 (FIG. 6C).

(Formation of First Conductive Layer)

Figure 6D:
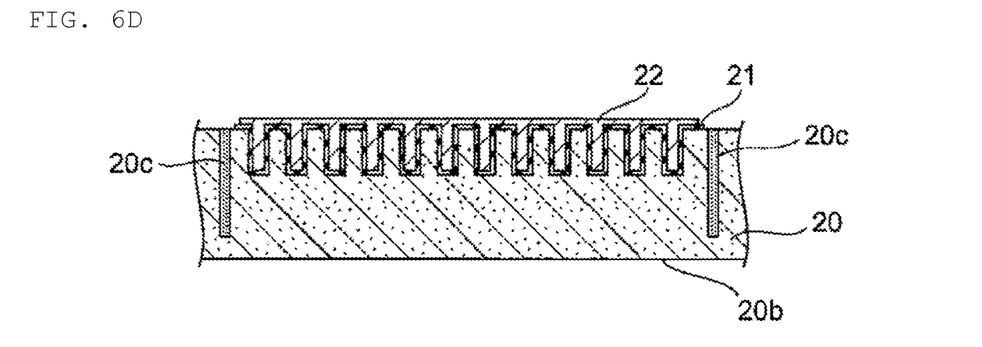
FIG. 6D is a schematic perspective view showing a manufacturing step of the semiconductor device according to the second exemplary embodiment.

Next, forming a polysilicon film on the dielectric layer 21 by a CVD method and performing patterning by photolithography and dry etching forms the first conductive layer 22 (FIG. 6D).

(Formation of Second Conductive Layer)

Figure 6E:
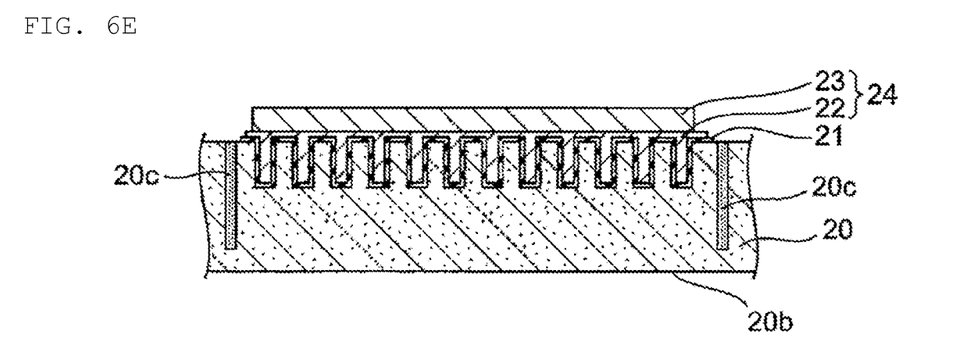
FIG. 6E is a schematic perspective view showing a manufacturing step of the semiconductor device according to the second exemplary embodiment.

Next, forming an aluminum film on the first conductive layer 22 by a sputtering method and performing patterning by photolithography and wet etching forms the second conductive layer 23. The first conductive layer 22 and the second conductive layer 23 form the first electrode layer 24. Here, the first electrode layer 24 is formed so that the high-resistance region 20c is positioned on the peripheral surface side of the semiconductor substrate 20 with respect to the end portion of the first electrode layer 24 in sectional view (FIG. 6E).

(Formation of Protective Layer)

Figure 6F:
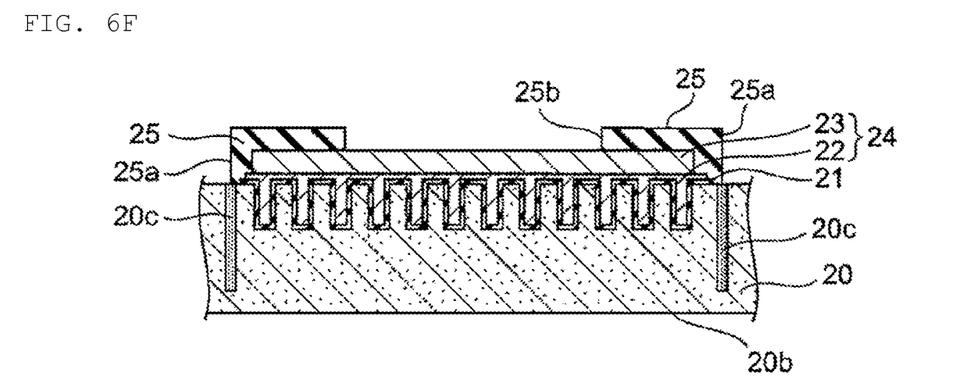
FIG. 6F is a schematic perspective view showing a manufacturing step of the semiconductor device according to the second exemplary embodiment.

Next, forming a silicon nitride film (Si$_3$N$_4$) by a CVD method so as to cover the end portion of the first electrode layer 24 and performing patterning by photolithography and dry etching forms the protective layer 25 having an opening 25b at the center in plan view (FIG. 6F). Here, the protective layer 25 is formed so that the high-resistance region 20c is positioned at least directly under the outer peripheral end portion 25a of the protective layer 25.

(Formation of Second Electrode Layer)

Figure 6G:
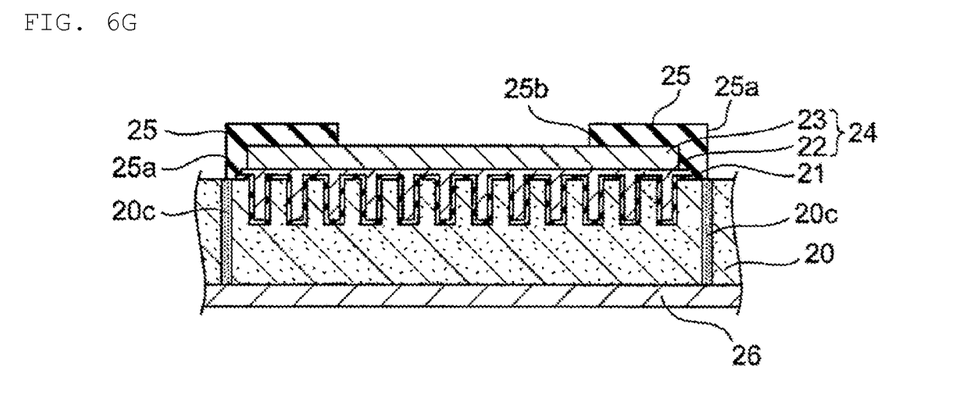
FIG. 6G is a schematic perspective view showing a manufacturing step of the semiconductor device according to the second exemplary embodiment.
Figure 6H:
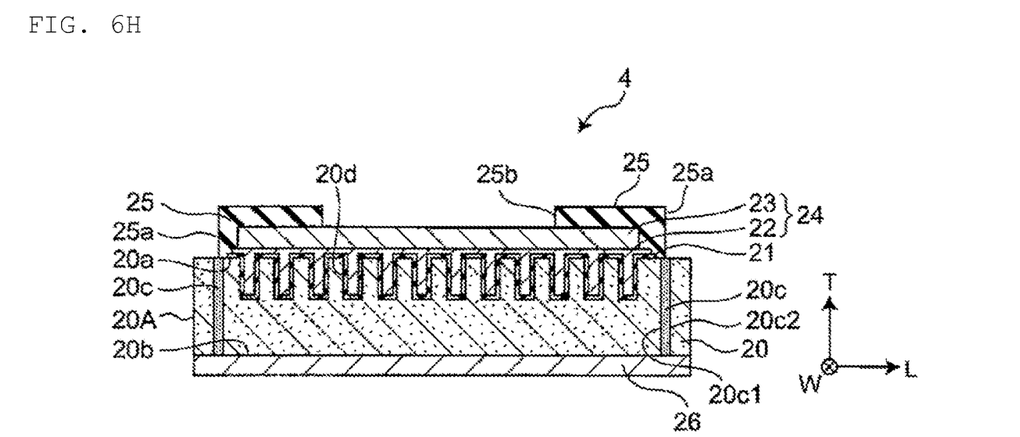
FIG. 6H is a schematic perspective view showing a manufacturing step of the semiconductor device according to the second exemplary embodiment.

Next, polishing the second main surface 20b of the semiconductor substrate 20 and forming the second electrode layer 26 made of an aluminum film by a sputtering method are performed (FIG. 6G).

(Separation into Individual Pieces)

Next, cutting the wafer 20 with a dicing machine and separating the semiconductor substrate into individual pieces obtains the semiconductor device 4 (FIG. 6H).

It is also noted that the semiconductor device according to the present embodiment can also be used under a DC bias or an AC bias, but can be suitably used under a DC bias in an alternative aspect. In this case, the semiconductor substrate is connected, as the positive electrode, to the positive electrode of the DC power supply, and the first electrode layer is connected, as the negative electrode, to the negative electrode of the DC power supply. It is also noted that when the semiconductor substrate is provided with the second electrode layer, the second electrode layer is connected, as a positive electrode, to the positive electrode of the DC power supply.

According to the present embodiment, as in the case of the first embodiment, since the semiconductor substrate includes a high-resistance region positioned at least directly under the outer peripheral end portion of the protective layer, anodization of the semiconductor substrate in the boundary region with the protective layer can be suppressed even when the semiconductor substrate becomes an anode. Thus, the occurrence of a structural defect at the end portion of the protective layer can be prevented, so that the reliability of the semiconductor device is improved. Furthermore, according to the present embodiment, since providing a trench on the surface of the semiconductor substrate makes it possible to increase the electrode area, there is also an effect that the capacitance per unit area of the semiconductor device can be increased.

Third Exemplary Embodiment

Figure 7:
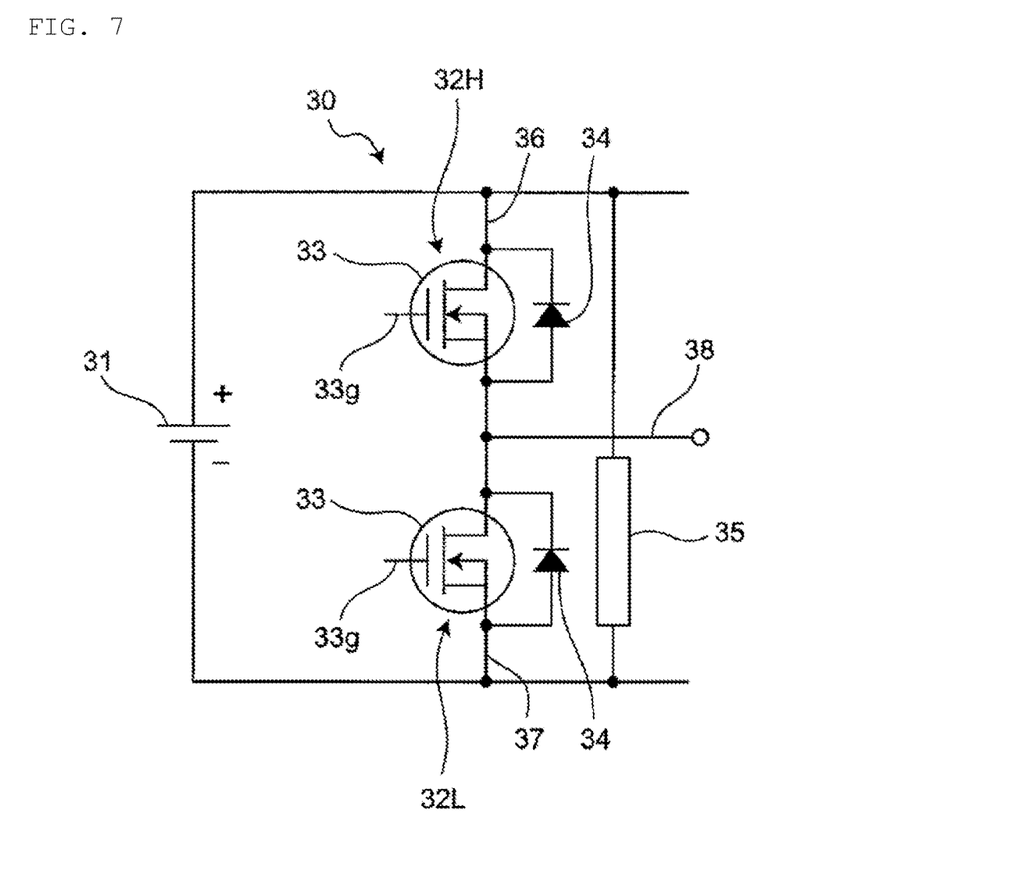
FIG. 7 is a circuit diagram showing a configuration of a semiconductor module according to a third exemplary embodiment.

The present embodiment relates to a semiconductor module including a semiconductor device according to the present invention. FIG. 7 is an example thereof, and the semiconductor module 30 includes a DC power supply 31, switching devices 32(H) and 32(L), diodes 34 connected to the respective switching devices 32(H) and 32(L), and a capacitor 35 connected to a positive electrode and a negative electrode of the DC power supply 31. For the capacitor 35, the semiconductor device of the present invention, for example, the semiconductor device of the first or second embodiment, is used.

Each switching device 32 includes a switching element 33 such as a MOSFET and a freewheel diode 34. On/off of the gate terminal 33g of the switching element 33 is controlled by a control circuit (not shown). A DC voltage applied between the positive electrode terminal 36 of the switching device 32H on the higher potential side and the negative electrode terminal 37 of the switching device 32L on the lower potential side is converted into an AC voltage, and the AC voltage is output from the output terminal 38. Here, the semiconductor substrate of the capacitor 35 is connected to the positive electrode terminal 36, and the first electrode layer of the capacitor 35 is connected to the negative electrode terminal 37. It is noted that when the semiconductor substrate of the capacitor 35 is provided with the second electrode layer, the second electrode layer of the capacitor 35 may be connected to the positive electrode terminal 36.

As described in the first and second embodiments, in the semiconductor devices of the first and second embodiments, the semiconductor substrate includes a high-resistance region positioned at least directly under the outer peripheral end portion of the protective layer. Therefore, even when the semiconductor substrate serves as an anode, almost no potential is applied to the high-resistance region. Thus, anodization of the semiconductor substrate of the capacitor 35 is suppressed, and the reliability of the capacitor 35 can be improved. According to the present embodiment, since the capacitor 35 constructed for suppressing anodization of the semiconductor substrate is used, the reliability of the semiconductor module is improved.

DESCRIPTION OF REFERENCE SYMBOLS

1, 2, 3, 4: Semiconductor device
10, 20: Semiconductor substrate
11, 21: Dielectric layer
12, 24: First electrode layer
13, 25: Protective layer
14, 26: Second electrode layer
10A, 20A: Outer peripheral surface
10a: First main surface
10b: Second main surface
10c, 10d: Side surface
20c, 10e, 10f, 10g: High-resistance region
20c1, 10e1, 10f1, 10g1: Inner peripheral side end portion
20c2, 10e2, 10f2, 10g2: Outer peripheral side end portion
30: Semiconductor module
31: DC power supply
32: Switching device
33: Switching element
33g: Gate terminal of switching element
34: Diode
35: Capacitor
36: Positive electrode terminal of switching element
37: Negative electrode terminal of switching element
38: Output terminal

The invention claimed is:

1. A semiconductor device comprising:
   a semiconductor substrate having a first main surface and a second main surface that oppose each other;
   a dielectric layer disposed on the first main surface of the semiconductor substrate;
   a first electrode layer disposed on the dielectric layer; and
   a protective layer covering at least an outer peripheral end of the dielectric layer and an outer peripheral end of the first electrode layer, with the protective layer disposed to expose an outer peripheral end on the first main surface of the semiconductor substrate,
   wherein the semiconductor substrate includes a high-resistance region positioned at least directly under an outer peripheral end of the protective layer, and
   wherein a resistivity of the high-resistance region is $10^2$ $\Omega\cdot cm$ or more and $10^9$ $\Omega\cdot cm$ or less.

2. The semiconductor device according to claim 1, wherein the high-resistance region is disposed closer to an outer peripheral end side of the semiconductor substrate than the outer peripheral end of the first electrode layer relative to a thickness direction of the semiconductor device.

3. The semiconductor device according to claim 2, wherein the high-resistance region further extends to the outer peripheral end side of the semiconductor substrate from the outer peripheral end of the protective layer relative to the thickness direction of the semiconductor device.

4. The semiconductor device according to claim 1, wherein the semiconductor substrate includes a low-resistance region other than where the high-resistance region is disposed in the semiconductor substrate.

5. The semiconductor device according to claim 4, wherein a resistivity of the low-resistance region is $10^{-5}$ $\Omega\cdot cm$ or more and less than $10^2$ $\Omega\cdot cm$.

6. The semiconductor device according to claim 1, wherein the semiconductor substrate is a silicon substrate, and the high-resistance region is silicon oxide.

7. The semiconductor device according to claim 1, further comprising at least one trench extending in the first main surface, wherein the dielectric layer is disposed along the trench.

8. The semiconductor device according to claim 7, wherein the high-resistance region is disposed to have a depth smaller than a depth of the trench extending in a thickness direction of the semiconductor substrate.

9. The semiconductor device according to claim 2, wherein the high-resistance region extends from the first main surface to the second main surface of the semiconductor substrate in the thickness direction.

10. The semiconductor device according to claim 1, wherein the semiconductor substrate comprises a positive electrode, and the first electrode layer is a negative electrode.

11. The semiconductor device according to claim 1, wherein the protective layer comprises an annular shape that covers the outer peripheral end of the dielectric layer and the outer peripheral end of the first electrode layer.

12. The semiconductor device according to claim 1, wherein the outer peripheral end of the protective layer is disposed inside an outer peripheral surface of the first main surface of the semiconductor substrate and has an opening in a central portion thereof.

13. The semiconductor device according to claim 1, wherein the high-resistance region comprises an annular shape so as to surround the first electrode layer in a plan view of the first main surface of the semiconductor substrate.

14. A semiconductor device comprising:
a semiconductor substrate having first and second main surfaces that oppose each other;
a dielectric layer disposed on the first main surface;
a first electrode layer disposed on the dielectric layer; and
a protective layer disposed on at least an outer peripheral end of the dielectric layer and an outer peripheral end of the first electrode layer,
wherein the semiconductor substrate includes a high-resistance region and a low-resistance region having a lower resistivity than a resistivity of the high-resistance region,
wherein the high-resistance region is disposed at least directly under an outer peripheral end of the protective layer, and
wherein the resistivity of the high-resistance region is $10^2$ Ω·cm or more and $10^9$ Ω·cm or less, and the resistivity of the low-resistance region is $10^{-5}$ Ω·cm or more and less than $10^2$ Ω·cm.

15. The semiconductor device according to claim 14, wherein the protective layer is disposed to expose an outer peripheral end on the first main surface of the semiconductor substrate.

16. The semiconductor device according to claim 14, further comprising:
at least one trench extending in the first main surface,
wherein the dielectric layer is disposed along the trench, and
wherein the high-resistance region is disposed to have a depth smaller than a depth of the trench extending in a thickness direction of the semiconductor substrate.

17. A semiconductor module comprising:
a DC power supply;
a switching device configured to turn on and off the DC power supply; and
the semiconductor device according to claim 1, with the semiconductor device being connected to a positive electrode and a negative electrode of the DC power supply.

18. The semiconductor module according to claim 17, wherein the semiconductor substrate of the semiconductor device is connected to the positive electrode of the DC power supply, and the first electrode layer of the semiconductor device is connected to the negative electrode of the DC power supply.

* * * * *